US009176648B1

(12) United States Patent
Laporte et al.

(10) Patent No.: US 9,176,648 B1
(45) Date of Patent: Nov. 3, 2015

(54) AUTHORING A VIRTUALIZED DATA CENTER

(71) Applicant: EMC Corporation, Hopkinton, MA (US)

(72) Inventors: Russell Laporte, Webster, MA (US); Daniel Collins, Princeton, MA (US); Ankita Pawar, Raleigh, NC (US); Jun Liang, Worcester, MA (US)

(73) Assignee: EMC Corporation, Hopkinton, MA (US)

( * ) Notice: Subject to any disclaimer, the term of this patent is extended or adjusted under 35 U.S.C. 154(b) by 94 days.

(21) Appl. No.: 13/720,458

(22) Filed: Dec. 19, 2012

(51) Int. Cl.
*G06F 15/177* (2006.01)
*G06F 3/0484* (2013.01)
*G06F 3/01* (2006.01)
*G06F 3/0481* (2013.01)
*G06F 17/30* (2006.01)

(52) U.S. Cl.
CPC .............. *G06F 3/0484* (2013.01); *G06F 3/017* (2013.01); *G06F 3/0481* (2013.01); *G06F 17/30283* (2013.01)

(58) Field of Classification Search
CPC .......... G06F 3/04847; G06F 17/30283; G06F 1/3215
USPC .......................................... 715/734; 235/375
See application file for complete search history.

(56) References Cited

U.S. PATENT DOCUMENTS

| | | | | |
|---|---|---|---|---|
| 7,913,192 B2* | 3/2011 | Dicke et al. | ................... | 715/864 |
| 8,171,142 B2 | 5/2012 | Kolin et al. | | |
| 8,457,013 B2* | 6/2013 | Essinger et al. | ............. | 370/254 |
| 8,493,408 B2* | 7/2013 | Williamson et al. | .......... | 345/629 |
| 8,769,043 B2* | 7/2014 | Flitcroft | ........................ | 709/217 |
| 8,803,660 B2* | 8/2014 | Martin et al. | ................ | 340/10.1 |
| 2011/0218730 A1 | 9/2011 | Rider et al. | | |
| 2011/0241833 A1 | 10/2011 | Martin et al. | | |
| 2014/0089296 A1* | 3/2014 | Burris | ........................... | 707/722 |
| 2014/0344766 A1* | 11/2014 | Cao et al. | ...................... | 715/863 |

OTHER PUBLICATIONS

Hattersley, "InData Systems a whitepaper on: Invisible and Fluorescing Bar Code Printing and Reading," (12 pages), Version 1.03, Industrial Data Entry Automation Systems Incorporated, retrieved from http://www.uvreaders.com/Technical-Documents.aspx.

Deffeyes and Katz, "Augmented Reality in the data center," Academy TechNotes, 2010, (1 page), ATN vol. 1 No. 2, IBM Academy of Technology.

Deffeyes, "Mobile augmented reality in the data center," IBM J. Res & Dev., Sep./Oct. 2011, (5 pages), vol. 55 No. 5 Paper 5.

Kan and Teng, "A Framework for Multifunctional Augmented Reality Based on 2D Barcodes," SIGGRAPH 2010, (1 page).

* cited by examiner

*Primary Examiner* — David Phantana Angkool
(74) *Attorney, Agent, or Firm* — Proskauer Rose LLP

(57) ABSTRACT

Described are methods, systems, and apparatus, including computer program products for authoring a virtual representation of a data center. An identity of a first IT component is determined. First position data indicating a position of the first IT component in the data center is received. The associated identity of the first IT component and the first position data is stored as a first part of the virtual representation of the data center. An identity of the second IT component is determined. Relative position data indicating a position of the second IT component relative to the first position data is received. Second position data indicating a position of the second IT component in the data center is determined. The associated identity of the second IT component and the second position data is stored as a second part of the virtual representation of the data center.

20 Claims, 15 Drawing Sheets

AUTHORING A VIRTUALIZED DATA CENTER

TECHNICAL FIELD

The present technology relates generally to data center management and, more specifically, to authoring and using a virtual representation of a data center.

BACKGROUND

In some implementations, a data center can provide computer processing and/or storage resources. A data center can support performing one or more prescribed processing tasks. In some common applications, for example, a data center can be used to implement any kind of network-accessible service (such as an Email service, search service, etc.). In some common applications, a data center can be used to implement storage, backup, and/or archival functionality.

A data center can include various physical resources to support and provide, e.g., computer processing and/or storage. A data center can include IT components, such as racks, servers, data storage devices, disk drives, networking equipment, and uninterruptible power supplies (UPSs). Data centers can include supporting resources, such as HVAC units, chillers, cooling equipment, generators, and battery backup systems. In some cases, the physical resources of a data center can be housed in an enclosure, such as a room or building. For a large-scale service, a data center can require a large number of physical resources occupying one or more buildings.

There have been recent developments in mobile computing devices such as laptops, smart phones, and tablets. In particular, mobile computing devices can provide a variety of functions such as a digital camera capable of functioning as an optical code scanner. Mobile computing devices can provide accelerometers, GPS receivers, and other sensors.

Optical code scanners can be used in applications that rely on optical codes, such as bar codes, Quick Response (QR) codes, or other matrix codes, to store information. Industries such as retail, airline, self service, automotive, parcel delivery, pharmaceutical and healthcare use optical codes to provide inventory control, customer identification, item tracking and many other functions. Optical code scanners scan or read an optical code that is typically attached to or printed on an object. A typical optical code is comprised of a number of bars or modules. Information is encoded in an optical code by the arrangement of bars or modules. When an optical code is placed within the field of view of a scanner, the scanner can read the bars or modules comprising the optical code and then use this data to decode the information encoded in the optical code. This operation is called decoding an optical code. The information produced by decoding an optical code can take the form of an alphanumeric string, numeric string, or binary string.

SUMMARY

As the number of the IT components in data centers increase, the management of the data centers becomes increasingly complex. Accordingly, there is a need to simplify the management of data centers. As described herein, virtual representations of data centers can be authored and used to facilitate management.

In one aspect, there is a method executed on a mobile computing device for authoring a virtual representation of a data center. The method can include scanning, by the mobile computing device, a first identification marker associated with a first IT component. The method can include determining, by the mobile computing device, an identity of the first IT component based on the first identification marker. The method can include receiving, by the mobile computing device, first position data indicating a position of the first IT component in the data center. The method can include associating, by the mobile computing device, the identity of the first IT component with the first position data. The method can include storing, by the mobile computing device, the associated identity of the first IT component and the first position data as a first part of the virtual representation of the data center. The method can include scanning, by the mobile computing device, a second identification marker associated with a second IT component. The method can include determining, by the mobile computing device, an identity of the second IT component based on the second identification marker. The method can include receiving, by the mobile computing device, relative position data indicating a position of the second IT component relative to the first position data. The method can include determining, by the mobile computing device, second position data indicating a position of the second IT component in the data center based on the first position data and the relative position data. The method can include associating, by the mobile computing device, the identity of the second IT component with the second position data. The method can include storing, by the mobile computing device, the associated identity of the second IT component and the second position data as a second part of the virtual representation of the data center.

In some embodiments, the method can include displaying, by the mobile computing device, a plurality of directional buttons, wherein receiving, by the mobile computing device, relative position data indicating the position of the second IT component relative to the first position data includes detecting, by the mobile computing device, selection of a directional button of the plurality of directional buttons.

In another aspect, there is a computer program product, tangibly embodied in a non-transitory computer readable storage medium, including instructions being operable to cause a mobile computing device to: scan a first identification marker associated with a first IT component; determine an identity of the first IT component based on the first identification marker; receive first position data indicating a position of the first IT component in the data center; associate the identity of the first IT component with the first position data; store the associated identity of the first IT component and the first position data as a first part of the virtual representation of the data center; scan a second identification marker associated with a second IT component; determine an identity of the second IT component based on the second identification marker; receive relative position data indicating a position of the second IT component relative to the first position data; determine second position data indicating a position of the second IT component in the data center based on the first position data and the relative position data; associate the identity of the second IT component with the second position data; and store the associated identity of the second IT component and the second position data as a second part of the virtual representation of the data center.

In some embodiments, the computer program product includes instructions being operable to cause a mobile computing device to display a plurality of directional buttons, wherein the instructions being operable to cause the mobile computing device to receive relative position data indicating the position of the second IT component relative to the first position data comprise instructions being operable to cause the mobile computing device to detect selection of a directional button of the plurality of directional buttons.

In another aspect, there is a mobile computing device including a scanner and a data center management module configured to: scan, with the scanner, a first identification marker associated with a first IT component; determine an identity of the first IT component based on the first identification marker; receive first position data indicating a position of the first IT component in the data center; associate the identity of the first IT component with the first position data; store the associated identity of the first IT component and the first position data as a first part of the virtual representation of the data center; scan, with the scanner, a second identification marker associated with a second IT component; determine an identity of the second IT component based on the second identification marker; receive relative position data indicating a position of the second IT component relative to the first position data; determine second position data indicating a position of the second IT component in the data center based on the first position data and the relative position data; associate the identity of the second IT component with the second position data; and store the associated identity of the second IT component and the second position data as a second part of the virtual representation of the data center.

In some embodiments, the mobile computing device includes a display, wherein the data center management module is configured to display on the display a plurality of directional buttons and receive relative position data indicating the position of the second IT component relative to the first position data by detecting selection of a directional button of the plurality of directional buttons.

In some embodiments, the relative position data indicating the position of the second IT component relative to the first position data indicates at least one of the second IT component is right of the first position data; the second IT component is left of the first position data; the second IT component is in front of the first position data; the second IT component is behind the first position data; the second IT component is below the first position data; the second IT component is above the first position data.

In some embodiments, the first IT component and the second IT component are racks. In some embodiments, the relative position data indicating the position of the second IT component relative to the first position data indicates the position of the second IT component within the first IT component. In some embodiments, the first IT component is a rack and the second IT component is one of a server, storage controller, or disk enclosure in the rack. In some embodiments, the first IT component is a disk enclosure and the second IT component is a hard drive. In some embodiments, the first identification marker and the second identification marker are QR codes.

BRIEF DESCRIPTION OF THE DRAWINGS

The foregoing and other objects, features, and advantages of the technology, as well as the technology itself, will be more fully understood from the following description of various embodiments, when read together with the accompanying drawings, in which.

DETAILED DESCRIPTION

Figure 1A:
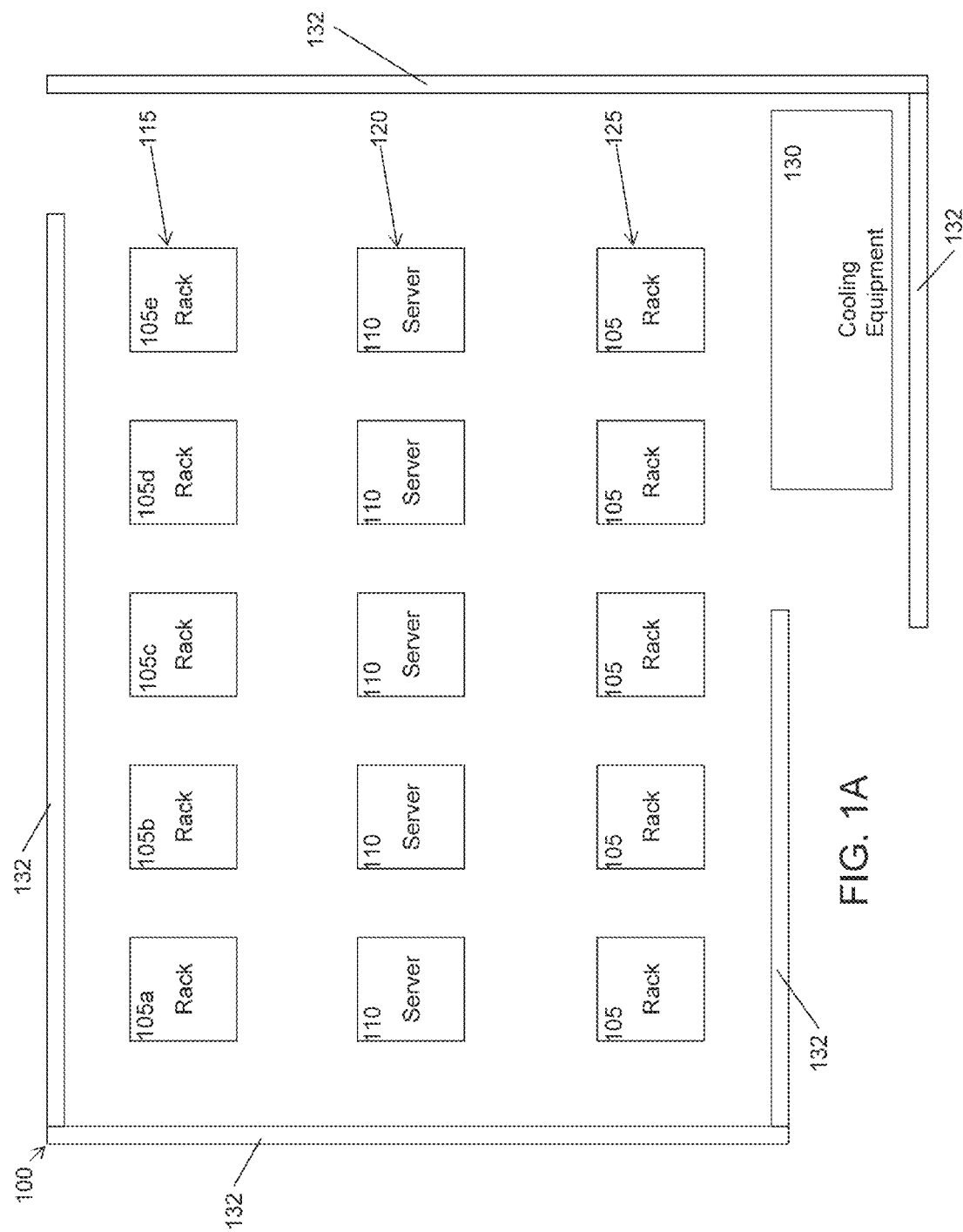
FIG. 1A depicts an exemplary data center.

Described herein is technology for managing data centers. The technology can be used to author a virtual representation of a data center. The virtual representation of the data center, or virtual data center, can be a computer-based model of the real-world data center. The virtual representation of the data center can include data that describes aspects of the data center. The virtual representation of the data center can include a representation of the building or room housing the data center. For example, the position of walls, floors, ceilings, doors, and other structural aspects in the data center can be included in the virtual representation of the data center. The virtual representation of the data center can include representations of IT components that are in the data center. For example, the position of racks, servers, data storage devices, disk drives, networking equipment, UPSs, HVAC units, chillers, cooling equipment, generators, and battery backup systems can be included in the virtual representation of the data center. Beneficially, a virtual representation of a data center can facilitate the management of the data center. For example, the IT components within the data center, and the location of those IT components within the data center, can be determined from the virtual representation of the data center. As another example, the cabling or re-cabling of IT components within the data center can be planned using the virtual representation of the data center.

The technology can involve a mobile computing device authoring and/or using a virtual representation of a data center. In some embodiments, a virtual data center can be authored by a mobile computing device. The mobile computing device can receive the positions of structural aspects of the data center and create the virtual representation of the data center. The mobile computing device can identify an IT component in the data center (e.g., by scanning an optical code on the IT component and/or referencing a database containing information about the IT component). The mobile computing device can receive position data indicating the position of the IT component in the data center (e.g., by input from a user or by determining the position programmatically). The mobile computing device can update the virtual representation of the data center to include the position data for the IT component. In some embodiments, a similar sequence can be performed for other IT components in the data center. The mobile computing device can use the virtual representation of the data center to determine information about the IT components in the data center.

In some embodiments, a virtual representation of a data center can be created to facilitate planning a data center. The virtual representation of the data center can include a representation of the building or room housing the data center. The virtual representation of the data center can include representations of IT components that will be added to the data center. The layout of the IT components can be planned using the virtual representation of the data center. The actual IT components can be placed in the data center in accordance with the virtual representation.

FIG. 1A depicts exemplary data center 100. Data center 100 includes various IT components, such as racks 105 and servers 110. As illustrated, multiple racks 105 are positioned in row 115, multiple servers 110 are positioned in row 120, and multiple racks 105 are positioned in row 125. Additionally, data center 100 contains cooling equipment 130. Racks 105 can house other IT components, such as servers, data storage devices, networking equipment, and UPSs. Servers 110 can be any kind of computing device. Data center 100 includes walls 132.

As described in greater detail below, the technology can involve creating a virtual representation of a data center, such as data center 100. For example, the technology can be used to create a virtual representation of data center 100 that includes the positions of racks 105, servers 110, cooling equipment 130, and walls 132.

Figure 1B:
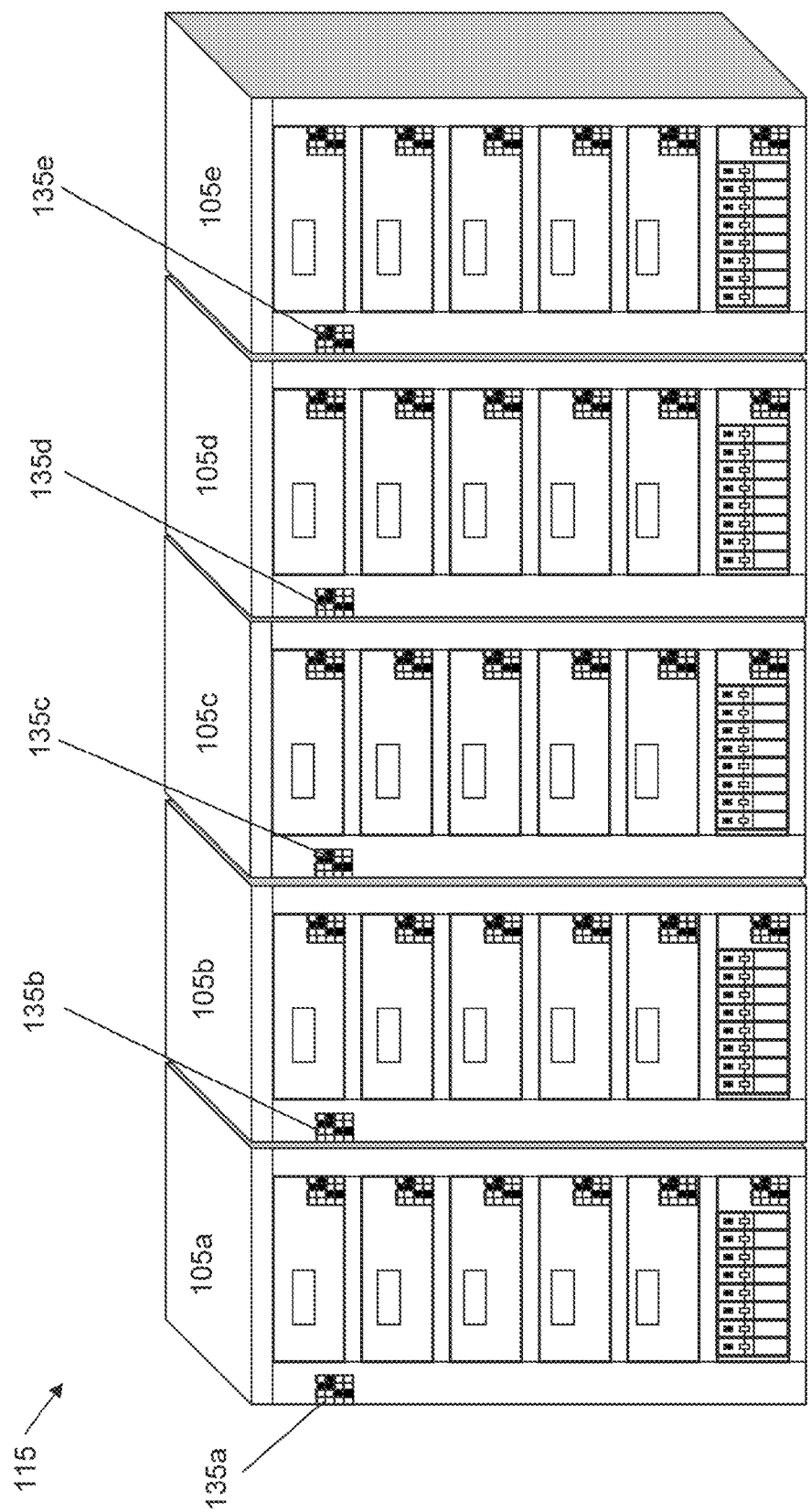
FIG. 1B depicts a row of racks in a data center.

FIG. 1B depicts row 115 of racks 105a-105e (generally racks 105) in data center 100. As illustrated in FIG. 1B, racks 105 include identification markers 135a-135e (generally identification markers 135). Identification marker 135a is attached to rack 105a, identification marker 135b is attached to rack 105b, identification marker 135c is attached to rack 105c, identification marker 135d is attached to rack 105d, and identification marker 135e is attached to rack 105e.

In some embodiments, identification markers can be applied directly to IT components. For example, identification markers 135 can be applied to racks 105 during the manufacturing process. In some embodiments, identification markers 135 can comprise ink, paint or powder coat applied to racks 105. In some embodiments, identification markers can be printed on paper or a label and affixed to the face of an IT component. In some embodiments, identification markers can be applied to servers 110.

Identification markers 135 are merely exemplary. In some embodiments, identification markers can be QR codes or bar codes. In some embodiments, identification markers can include any kind of optical code, such as Codabar, Code 11, EAN-13, EAN-8, MSI, Plessey, PostNet, UPC-A, UPC-E, LOGMARS, PDF417, DataMatrix, or Maxicode optical codes.

Identification markers can represent data. In some QR codes, the arrangement of black modules and white modules can represent an alphanumeric string. In some embodiments, an identification marker can represent information about the IT component to which it is attached. In some embodiments, an identification marker can represent an IT component's serial number or other number assigned by its manufacturer. In some embodiments, an identification marker can represent an IT component identifier assigned by the system owner. In some embodiments, an identification marker can represent additional information about an IT component, such as IT components it contains, its IP address, etc.

Figure 1C:
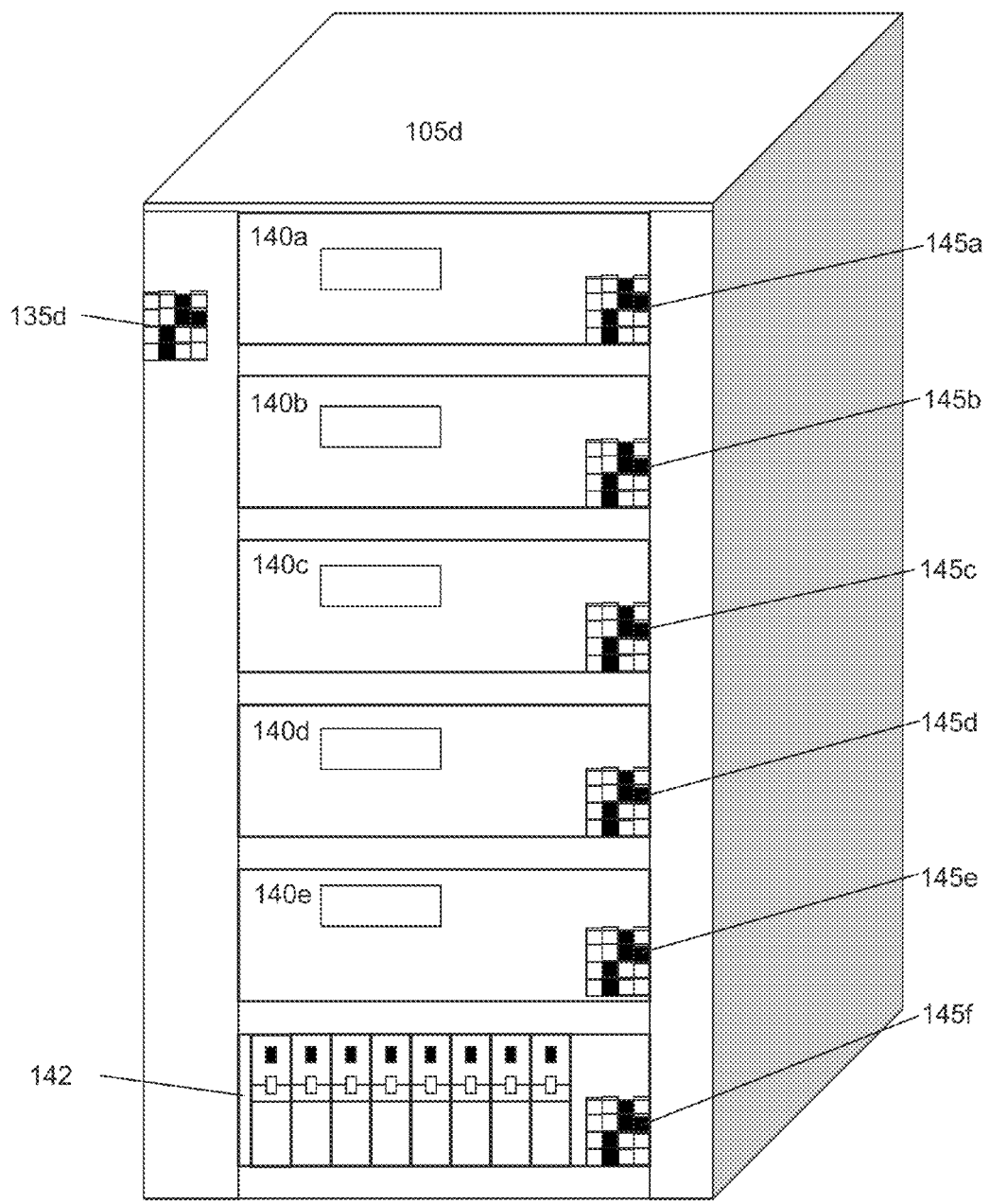
FIG. 1C depicts a rack in a data center.

FIG. 1C depicts rack 105d in data center 100. As illustrated in FIG. 1C, rack 105d includes identification marker 135d. Rack 105d includes servers 140a-140e (collectively servers 140) and disk enclosure 142 (e.g., servers 140 and disk enclosure 142 are installed in rack 105d). Servers 140 and disk enclosure 142 include identification markers 145a-145f (collectively identification markers 145). Identification marker 145a is attached to server 140a, identification marker 145b is attached to server 140b, identification marker 145c is attached to server 140c, identification marker 145d is attached to server 140d, identification marker 145e is attached to server 140e, and identification marker 145f is attached to disk enclosure 142. Disk enclosure 142 can contain disk drives with identification markers attached (not shown).

Figure 2A:
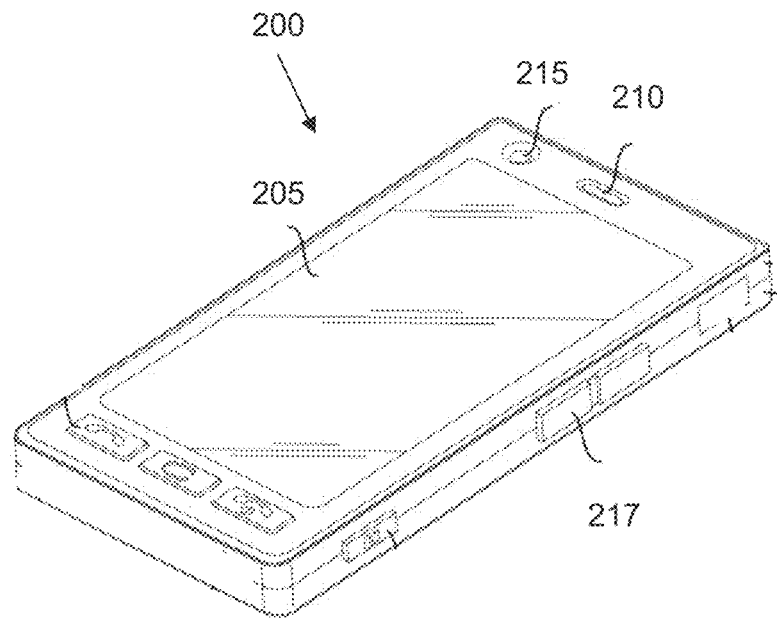
FIG. 2A depicts a front view of a mobile computing device.

FIG. 2A depicts a front view of a mobile computing device 200. As shown in FIG. 2A, mobile computing device 200 can have a bar-type body. In some embodiments, a mobile computing device can be a smartphone, cellular phone, tablet computer, laptop computer, or other computing device that can be brought into a data center. Mobile computing device 200 can include display 205, audio output unit 210, camera 215, and user input unit 217. In some embodiments, display 205 can be touch sensitive (e.g., a user can provide input to mobile computing device by touching display 205).

Figure 2B:
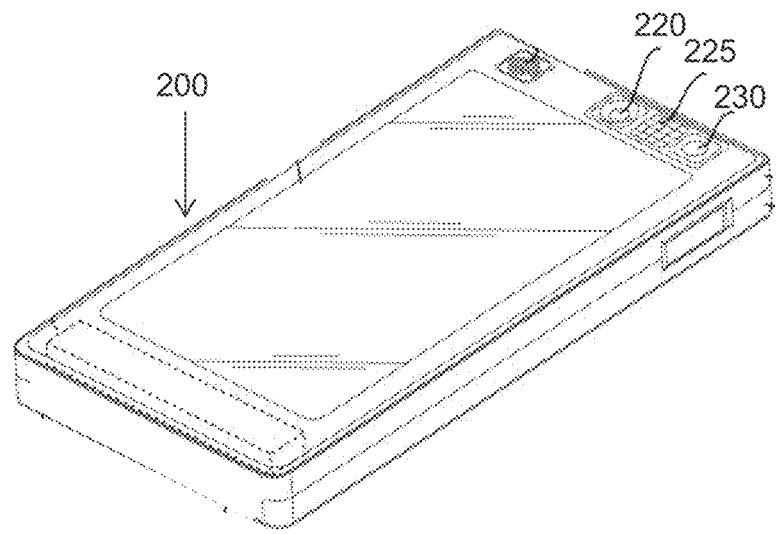
FIG. 2B depicts a back view of a mobile computing device.

FIG. 2B depicts a back view of mobile computing device 200. As shown in FIG. 2B, mobile computing device 200 can include camera 220. Camera 220 can have a photographing direction that is substantially opposite to a photographing direction of camera 215 and can have pixels differing from pixels of camera 215. Mobile computing device 200 can include flash 225 adjacent to the camera 220. Flash 225 can emit light toward a subject in case of photographing the subject using camera 220.

Mobile computing device 200 can include antenna 230 for communication.

Figure 2C:
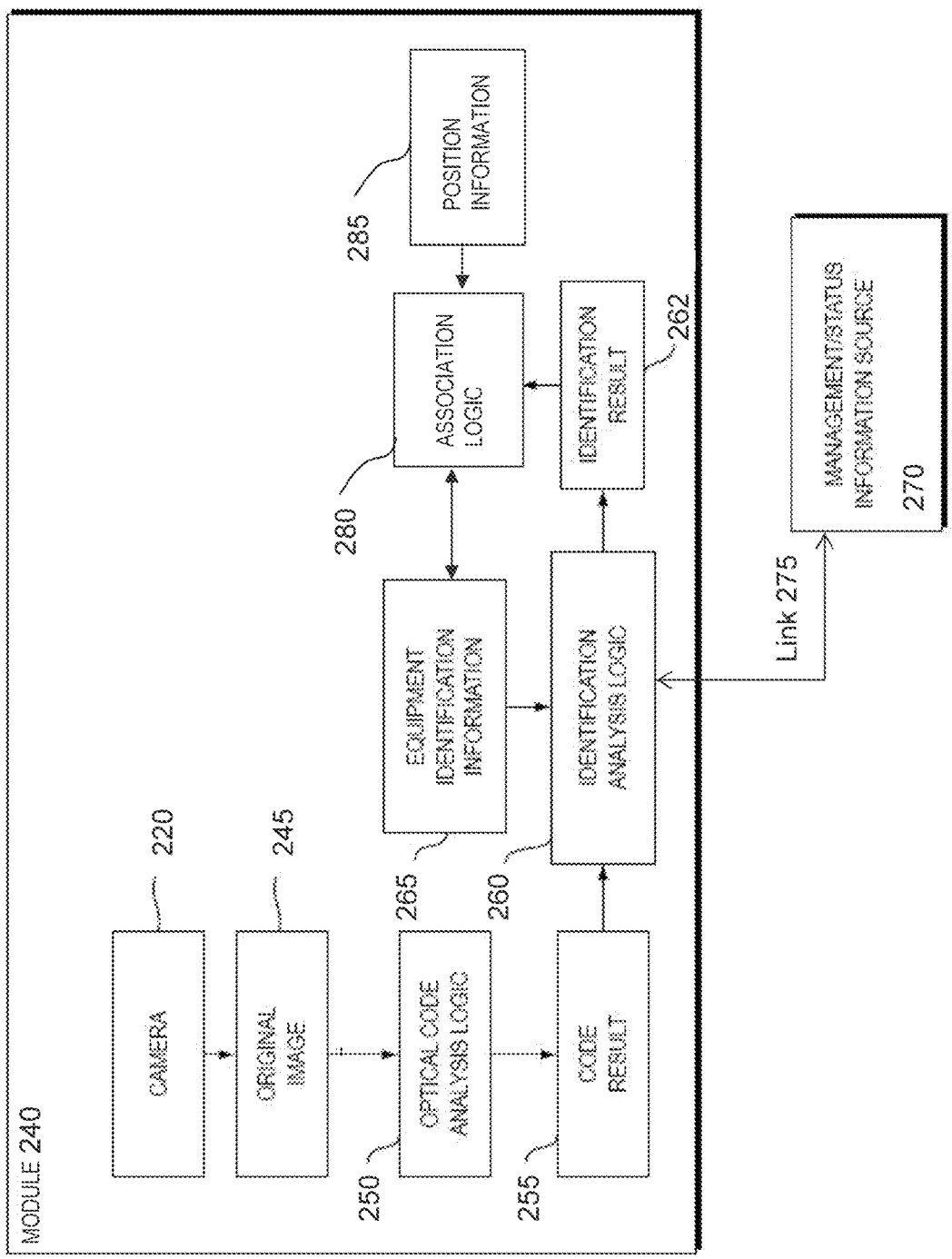
FIG. 2C depicts a block diagram of data center management module of a mobile computing device.

FIG. 2C depicts a block diagram of a data center management module 240 of mobile computing device 200. Camera 220 can produce original image 245. Optical code analysis logic 250 can include logic that can be used to interpret one or more optical codes in original image 245, to produce code result 255. In some embodiments, code result 255 can include the decoded value or values for each optical code within original image 245 and the location of each optical code within original image 245.

Identification analysis logic 260 can, for example, determine an identification result 262 (e.g., the identity of an IT component) based on code result 255. In some embodiments, for example, code result 255 can be the decoded value of an optical code. Identification analysis logic 260 can, based on the decoded value of the optical code, request an IT component identity from equipment identification information 265 and/or management/status information source 270. For example, if code result 255 includes a serial number of an IT component and equipment identification information 265 includes a database mapping serial numbers of IT components to IT component identities (e.g., IP address, system name, model, manufacturer, and/or other specification data), identification analysis logic 260 can retrieve IT component identities from equipment identification information 265. In the illustrated embodiment, equipment identification information 265 can be stored on mobile computing device 200. As another example, if code result 255 includes a serial number of an IT component and management/status information source 270 includes a database mapping serial numbers of IT components to IT component identities, identification analysis logic 260 can retrieve IT component identities from management/status information source 270. In some embodiments, IT component status information can be retrieved from management/status information source 270. In the illustrated embodiment, management/status information source 270 can be a separate computing device from mobile computing device 200 (e.g., a server). Mobile computing device 200 can communicate with management/status information source 270 via link 275 (e.g., via a WIFI connection over antenna 230).

Association logic 280 can associate identification result 262 and position information 285 (e.g., associate position information 285 and identification result 262, thereby indicating that they relate to an IT component). Association logic 280 can store the associated position information 285 and identification result 262 to a virtual data center. In some embodiments, the virtual data center can be stored in equipment identification information 265 of mobile computing device 200. In some embodiments, the virtual data center can be stored on an external server.

Link 275 can enable communications between identification analysis logic 275 and external sources, such as management/status information source 270. Link 275 can be one or more TCP/IP lines, which may use a known protocol such as NFS, HTTP, and Windows Networking Link 275 can be a WIFI or WAN or other wireless connection, or a dedicated physical connection such as a USB or serial connection.

Management/status information source 270 can be, can include, or can be included in a management system for IT components. Management/status information source 270 can support one or more interfaces such as an application programming interface (API), command line interface (CLI), graphical user interface (GUI), or web services.

Identification analysis logic 260 can obtain management and/or status information about IT components from Management/status information source 270. For example, Identification analysis logic 260 can obtain status information (e.g., utilization, runtime, etc.) about IT components from Management/status information source 270.

Virtual Data Center Data

As described above, a virtual data center can be a computer-based model. For example, a virtual data center can be a computer-based model including one or more objects or data structures. In some embodiments, physical items in the data center can be represented by objects (e.g., each rack, server, HVAC, wall, etc. is represented by an object). In some embodiments, items in the data center can be represented by container objects (e.g., instances of a container class). For example, each rack, server, disk enclosure, disk drive, identification marker, HVAC, wall, etc. in the data center can be represented by a container object in the virtual representation of the data center. In some embodiments, each rack, server, HVAC, wall, etc. in the data center is represented by an instance of a class derived from the container class (e.g., rack class, server class, HVAC class, wall class, etc.).

In some embodiments, the virtual data center can be a hierarchy of container objects. For example, a container object can be the child of another container object (its parent) (e.g., to denote the child is contained by the parent). A container object can be a parent of one or more other container objects (its children). A container object can have no parent or children. For example, with reference to FIGS. 1A-1C, data center 100, rack 105*d*, servers 140, disk enclosure 142, and identification markers 135 and 145 can each be represented by a separate container object. The container object representing data center 100 can be the parent of the container object representing rack 105*d* to denote rack 105*d* is contained in data center 100. The container object representing rack 105*d* can be the parent of the container objects representing servers 140 and disk enclosure 142 to denote that servers 140 and disk enclosure 142 are installed in rack 105*d*. The container object representing rack 105*d* can be the parent of the container object representing identification marker 135*d*.

A container object can have member variables representing information about the item in the data center that the container object represents. The container object can have member variables that store the manufacturer, model, serial number, system identification, etc. for the item that the container object represents. The container object can have member variables that store position data for the item that the container object represents. In some embodiments, position data can include coordinates (e.g., (x,y,z)) in 3D space of the item that the container object represents. The coordinates can be relative to a coordinate system based on the data center (e.g., where in the data center the item is located). The coordinates can be relative to a coordinate system based on a parent object (e.g., where in a rack a server is located or where on the face of a server an identification marker is located). In some embodiments, position data can include the dimensions or size for the item that the container object represents (e.g., width, height, and depth). In some embodiments, position data can include a three dimensional vector indicating the direction in which the item that the container object represents is facing.

Authoring a Virtual Data Center

Figure 3:
FIG. 3 depicts a flow chart for a method of authoring a virtual representation of a data center.

Mobile computing device 200 can author a virtual representation of a data center (e.g., data center 100). FIG. 3 depicts flow chart 300 for a method of authoring a virtual representation of a data center. FIGS. 4A-4F depict mobile computing device 200 authoring a virtual representation of a data center. In the illustrated example, representations of rack 105*d* and rack 105*e* are added to the virtual representation of data center 100.

Figure 4A:
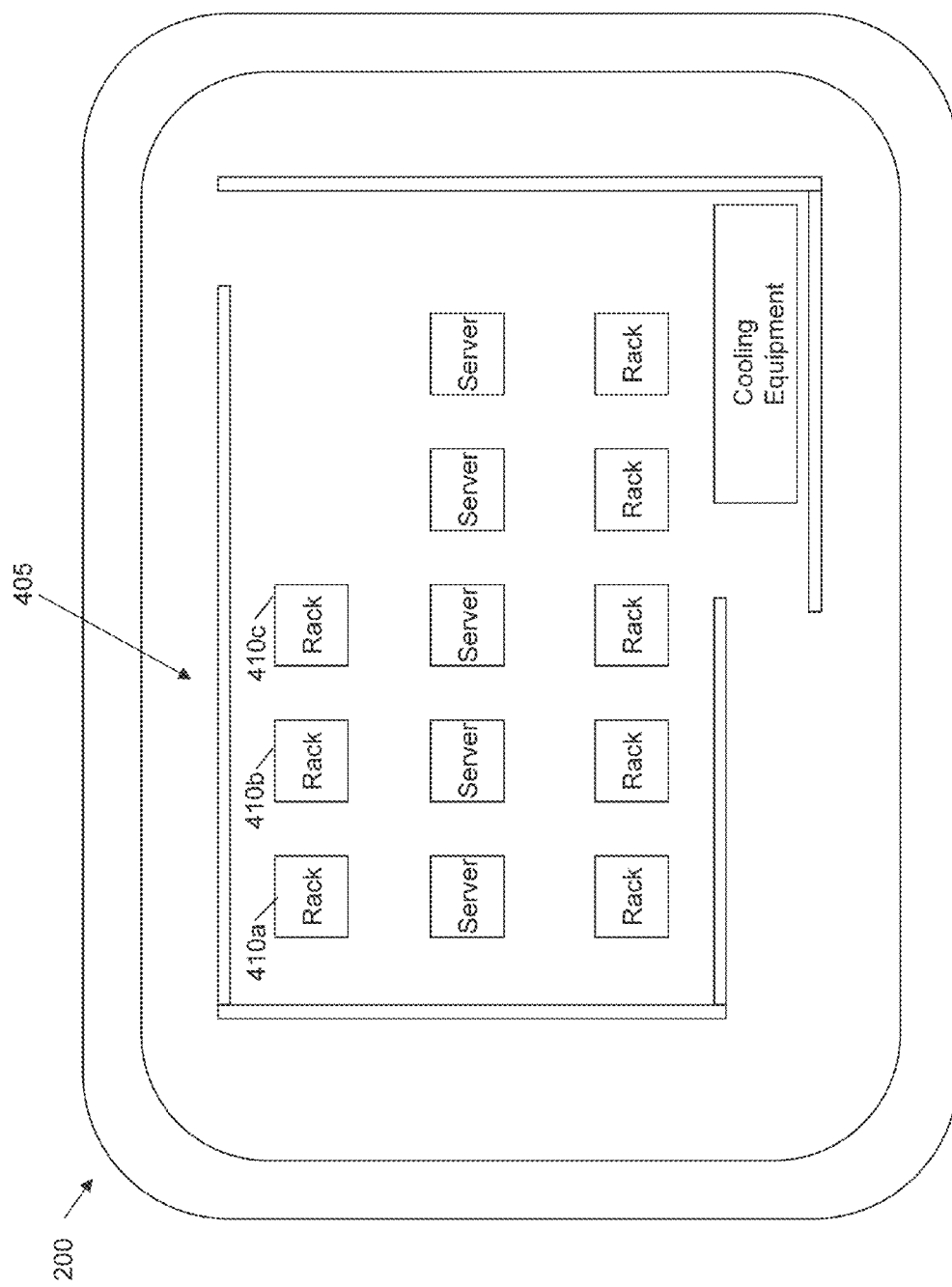
FIGS. 4A-4F depict a mobile computing device authoring a virtual representation of a data center.

With reference to FIG. 4A, mobile computing device 200 can display a visualization 405 of a virtual representation of data center 100. For example, graphic 410*a* in visualization 405 represents rack 105*a* in data center 100, graphic 410*b* in visualization 405 represents rack 105*b* in data center 100, and graphic 410*c* in visualization 405 represents rack 105*c* in data center 100. Visualization 405 can reflect the spatial positions of IT components in data center 100. As shown in FIG. 4A, the virtual representation of data center 100 does not include a representation of racks 105*d* and 105*e*, and accordingly visualization 405 does not include graphics representing racks 105*d* and 105*e*. As described below, mobile computing device 200 can add representations of racks 105*d* and 105*e* to the virtual representation of data center 100.

In some embodiments, mobile computing device 200 can scan a first identification marker associated with a first IT component (step 305). For example, mobile computing device 200 can use camera 220 to acquire an image (e.g., original image 245) of rack 105*d*, including identification marker 135*d*. In some embodiments, mobile computing device 200 can use camera 220 to acquire an image in response to receiving a signal from user input unit 217. Mobile computing device 200 can use optical code analysis logic 250 of data center management module 240 to locate in original image 245 identification marker 135*d* on rack 105*d*.

In some embodiments, mobile computing device 200 can determine an identity of the first IT component based on the first identification marker (step 310). For example, mobile computing device 200 can use optical code analysis logic 250 of data center management module 240 to generate code result 255 by processing the image of identification marker 135*d* on rack 105*d*. In some embodiments, code result 255 can be an identity of rack 105*d* (e.g., the serial number of rack 105*d*). In some embodiments, code result 255 can be used to determine the identity of rack 105*d*. For example identification analysis logic 260 can use code result 255 to query equipment identification information 265 and/or management/status information source 270 for the identity of rack 105*d*.

Figure 4B:
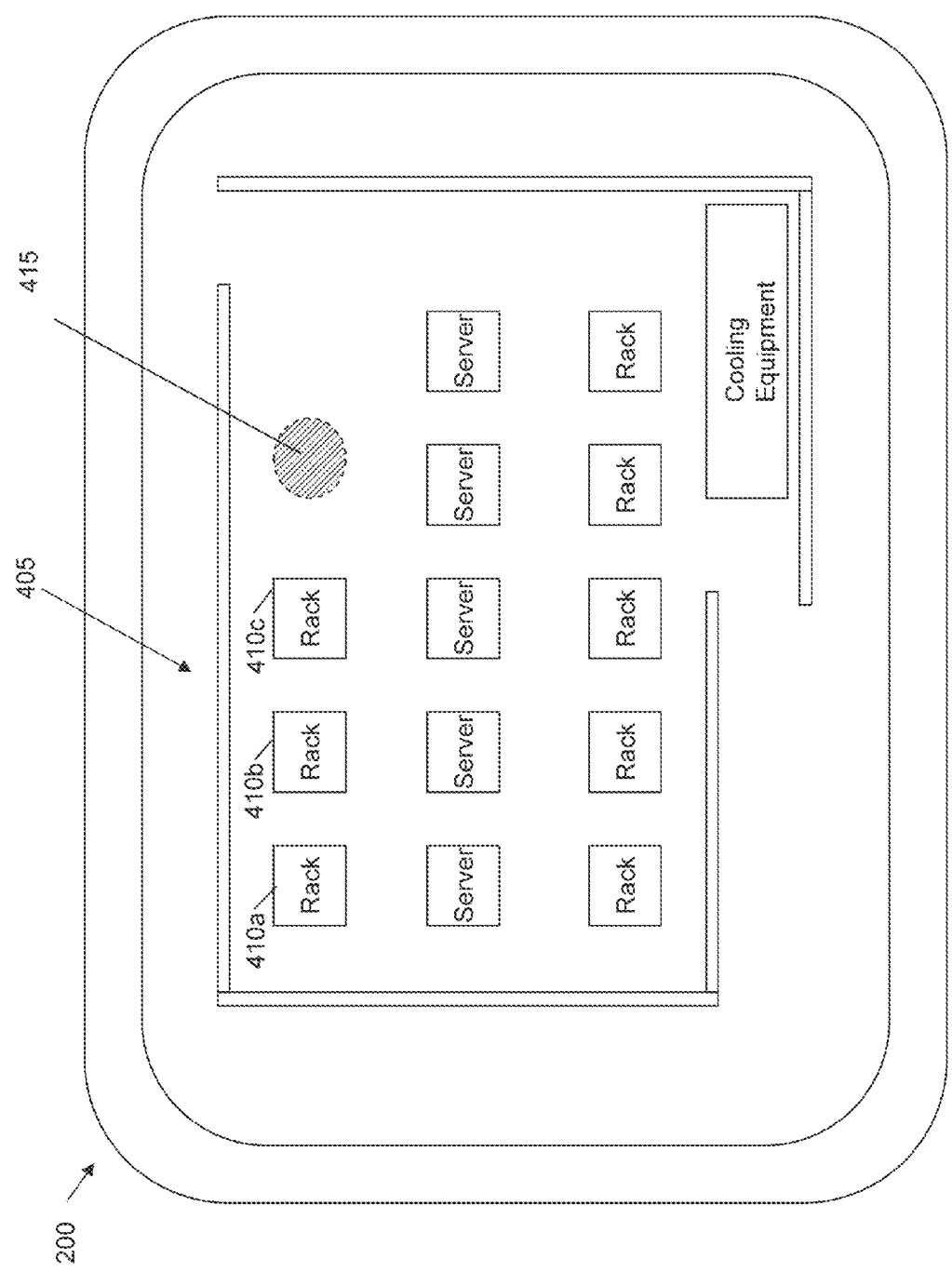

In some embodiments, mobile computing device 200 can receive first position data indicating a position of the first IT component in the data center (step 315). For example, association logic 280 can receive position information 285. Position information 285 can be received from a user. As illustrated in FIG. 4B, mobile computing device 200 can receive position information 285 via user gesture 415 (e.g., a user tapping display 205 to indicate the position of rack 105*d* in data center 100). In some embodiments, a user can supply the position of rack 105*d* in data center 100 by entering values (e.g., coordinates of rack 105*d* in data center 100) into a text field on mobile computing device 200. As noted above, position data can include the dimensions or size for the item that the container object represents (e.g., width, height, and depth). In some embodiments, position data can include a three dimensional vector indicating the direction in which item that the container object represents is facing.

In some embodiments, some or all position data can be retrieved from equipment identification information 265 and/or management/status information source 270. For example, an IT components model number can be determined from its identity. Based on the model number, the dimensions of the IT component can be retrieved from equipment identification information 265 and/or management/status information source 270.

In some embodiments, mobile computing device 200 can associate the identity of the first IT component with the first position data (step 320). For example, association logic 280 can associate the identity of rack 105*d*, as determined in step 310, with the position data received in step 315. For example, association logic 280 can create an object representing rack 105*d*, populate the member variables that store, e.g., serial number or system identification, and populate the member variables that store position data.

Figure 4C:
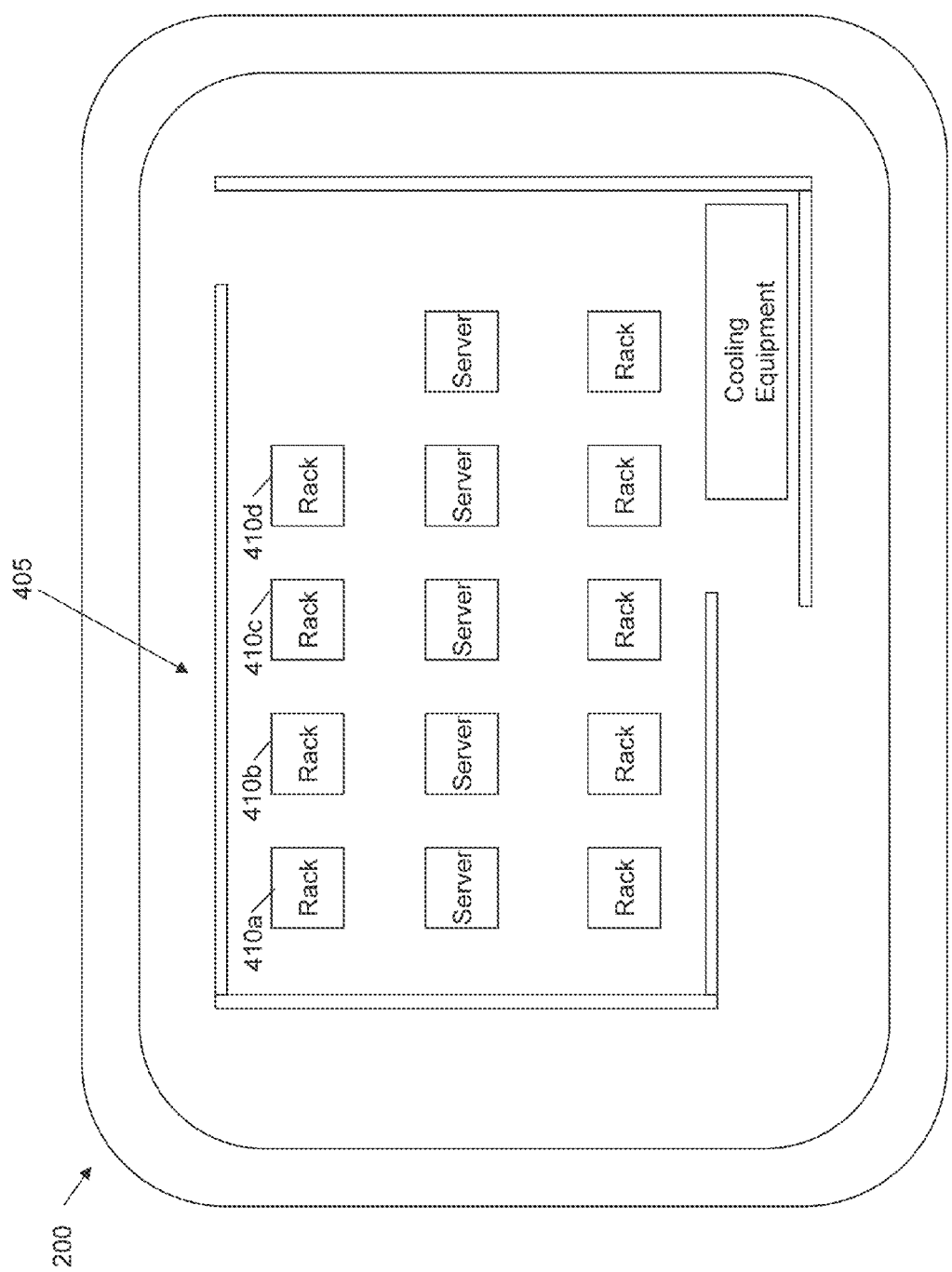

In some embodiments, mobile computing device 200 can store the associated identity of the first IT component and the first position data as a first part of the virtual representation of the data center (step 325). For example, association logic 280 can add an object representing rack 105*d* as a part of the virtual representation of data center 100. In some embodiments, the object representing rack 105*d* can be a child of the object representing data center 100. With reference to FIG. 4C, a representation of rack 105*d* is added to the virtual representation of data center 100, and accordingly visualization 405 includes graphic 410*d* representing rack 105*d*.

In some embodiments, mobile computing device 200 can scan a second identification marker associated with a second IT component (step 330). For example, mobile computing device 200 can use camera 220 to acquire an image (e.g., original image 245) of rack 105*e*, including identification marker 135*e*. In some embodiments, mobile computing device 200 can use camera 220 to acquire an image in response to receiving a signal from user input unit 217. Mobile computing device 200 can use optical code analysis logic 250 of data center management module 240 to locate in original image 245 identification marker 135*e* on rack 105*e*.

In some embodiments, mobile computing device 200 can determine an identity of the second IT component based on the second identification marker (step 335). For example, mobile computing device 200 can use optical code analysis logic 250 of data center management module 240 to generate code result 255 by processing the image of identification marker 135*e* on rack 105*e*. In some embodiments, code result 255 can be an identity of rack 105*e* (e.g., the serial number of rack 105*e*). In some embodiments, code result 255 can be used to determine the identity of rack 105*e*. For example identification analysis logic 260 can use code result 255 to query equipment identification information 265 or management/status information source 270 for the identity of rack 105*e*.

Figure 4D:
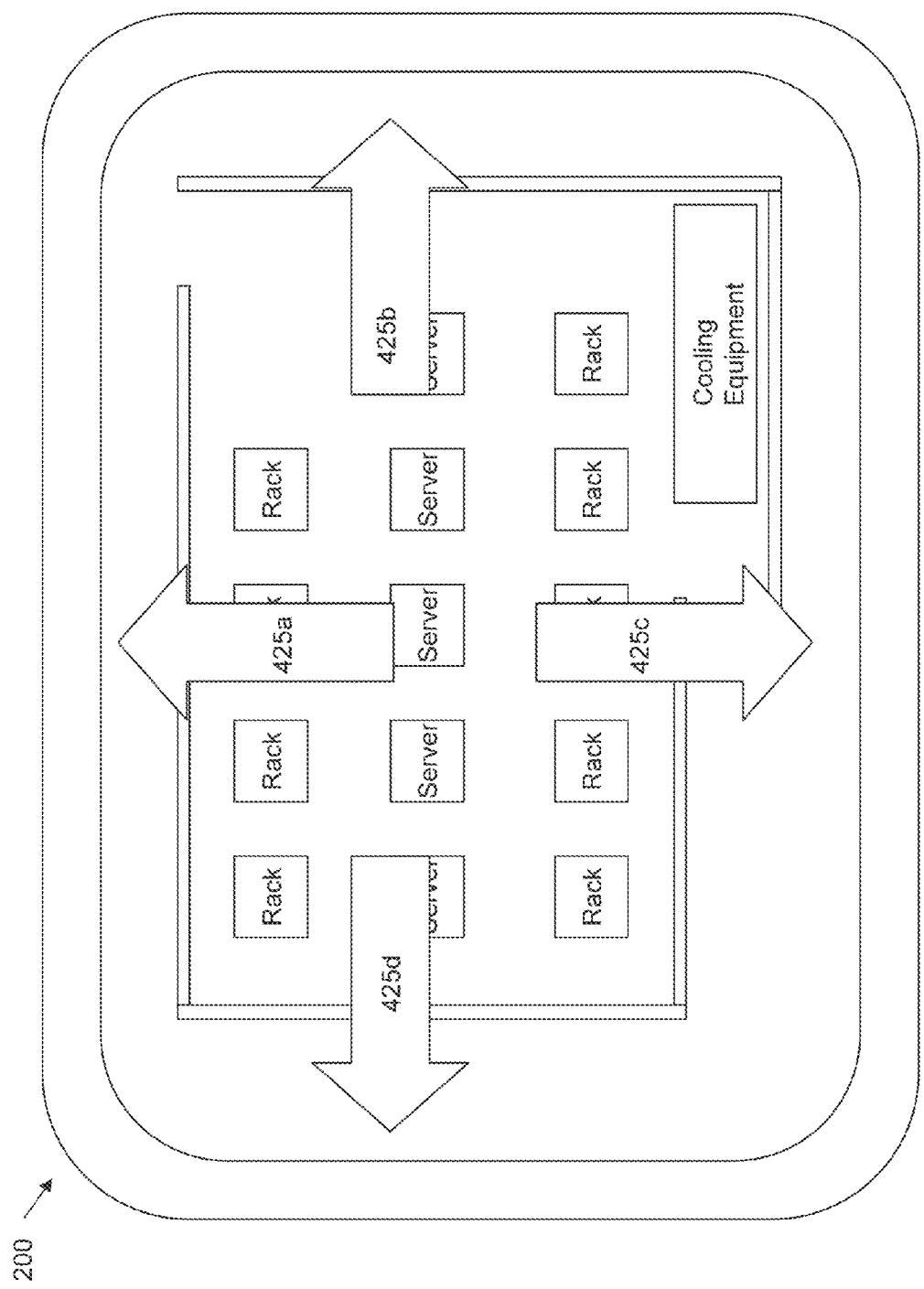
Figure 4E:
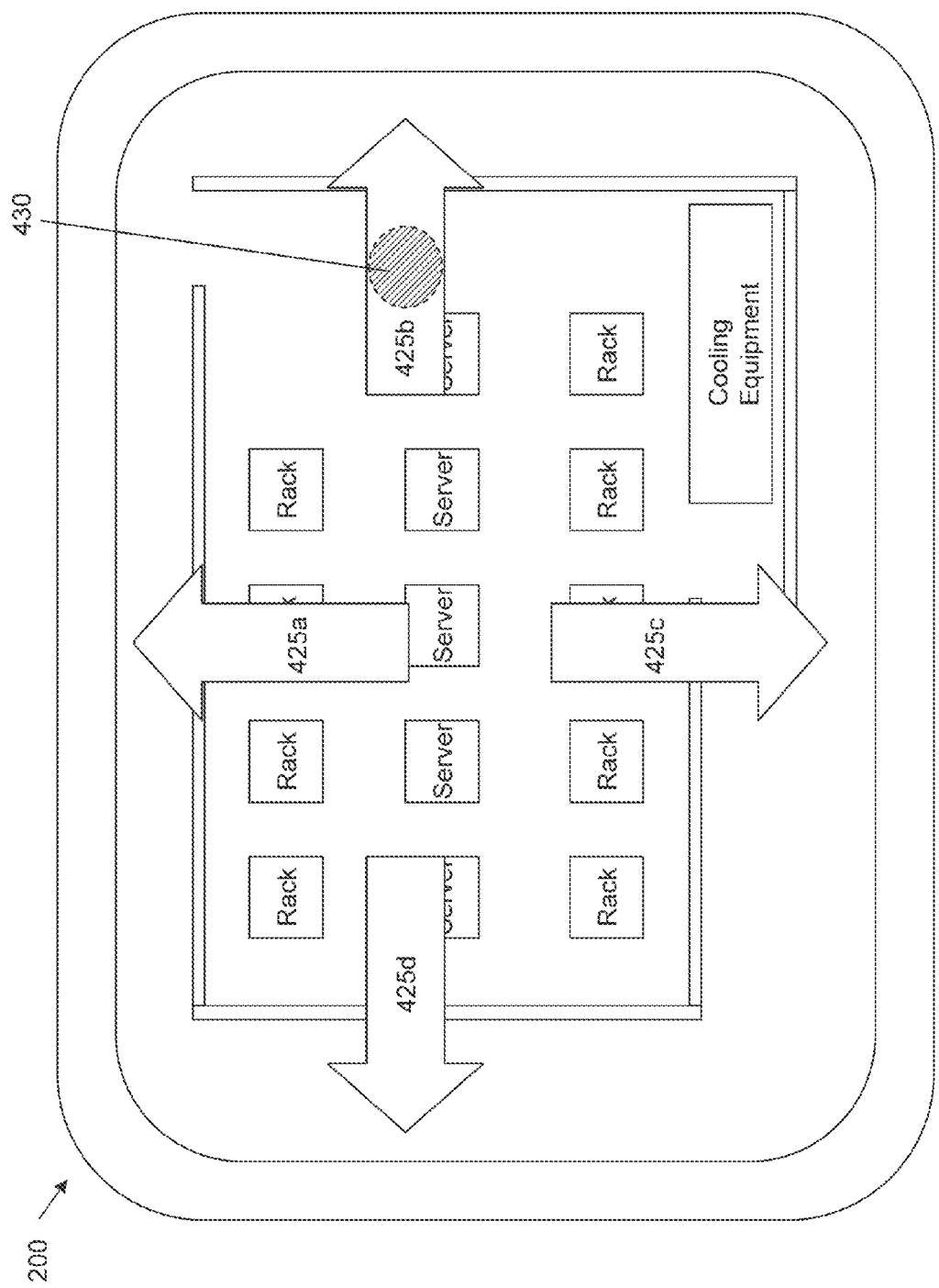

In some embodiments, mobile computing device 200 can receive relative position data indicating a position of the second IT component relative to the first position data (step 340). Relative position information can be received from a user. As illustrated in FIG. 4D, mobile computing device can prompt the use to enter relative position information by displaying arrows 425*a*-425*d*. As illustrated in FIG. 4E, the user can provide relative position information via user gesture 430 (e.g., a user tapping display 205 to select arrow 425*b* to indicate rack 105*e* is to the right of rack 105*d* in data center 100). In some embodiments, selection of arrow 425*a* indicates the current IT component is behind the previous IT component, selection of arrow 425*c* indicates the current IT component is in front of the previous IT component, and selection of arrow 425*d* indicates the current IT component is to the left of the previous IT component.

In some embodiments, mobile computing device 200 can determine second position data indicating a position of the second IT component in the data center based on the first position data and the relative position data (step 345). For example, association logic 280 can determine the position data for rack 105*e* in data center 100 based on the relative position data received in step 340 and the position data for rack 105*d*. In some embodiments, for example, association logic 280 can determine that rack 105*e* is located to the right of rack 105*d*, and separated by a pre-determined rack spacing distance.

In some embodiments, mobile computing device 200 can associate the identity of the second IT component with the second position data (step 350). For example, association logic 280 can associate the identity of rack 105*e*, as determined in step 310, with the position data received in step 315. For example, association logic 280 can create an object representing rack 105*e*, populate the member variables that store, e.g., serial number or system identification, and populate the member variables that store position data.

Figure 4F:
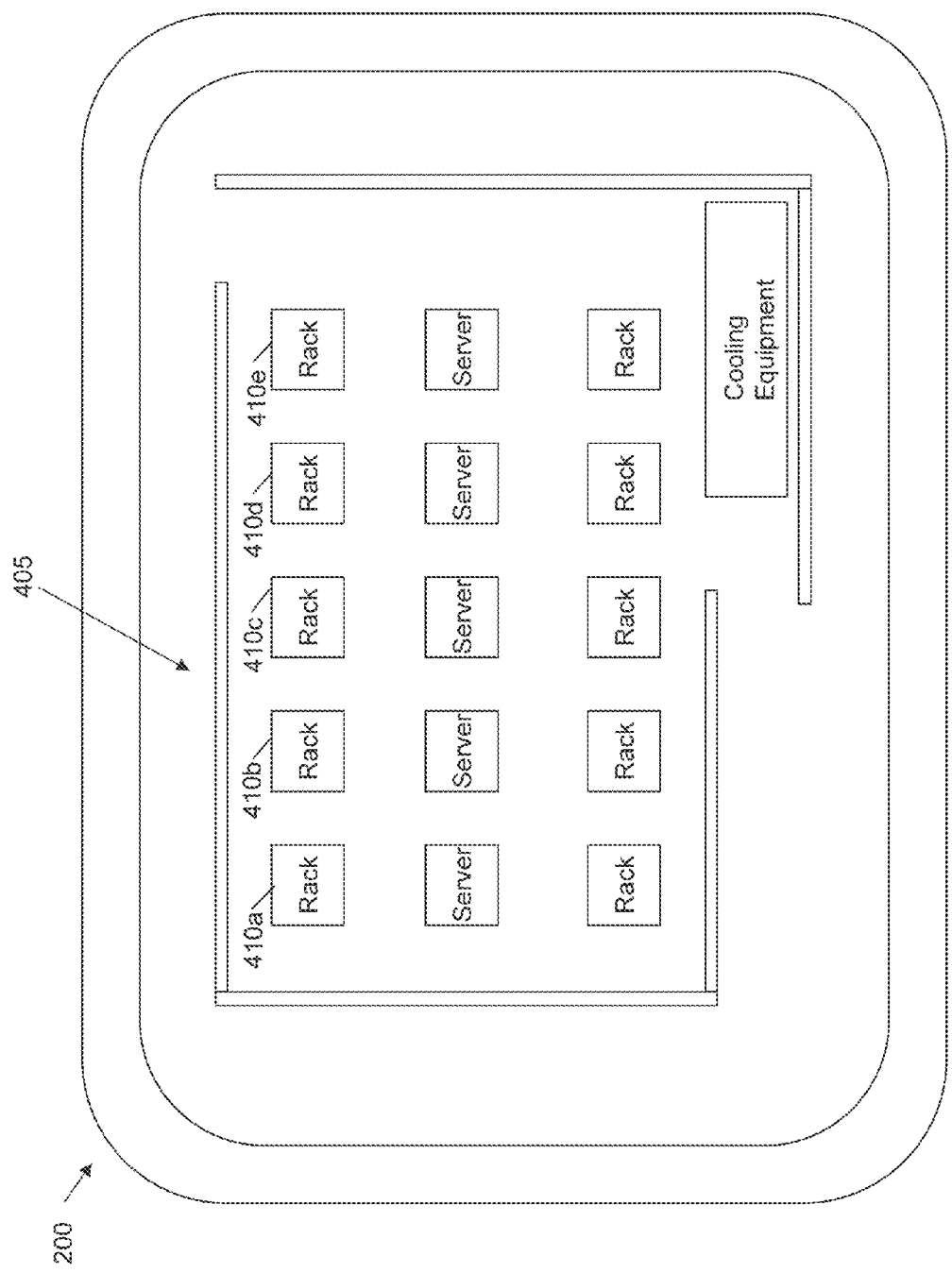

In some embodiments, mobile computing device 200 can store the associated identity of the second IT component and the second position data as a second part of the virtual representation of the data center (step 355). For example, association logic 280 can add an object representing rack 105*e* as a part of the virtual representation of data center 100. In some embodiments, the object representing rack 105*e* can be a child of the object representing data center 100. With reference to FIG. 4F, a representation of rack 105*e* is added to the virtual representation of data center 100, and accordingly visualization 405 includes graphic 410*e* representing rack 105*e*.

Figure 5A:
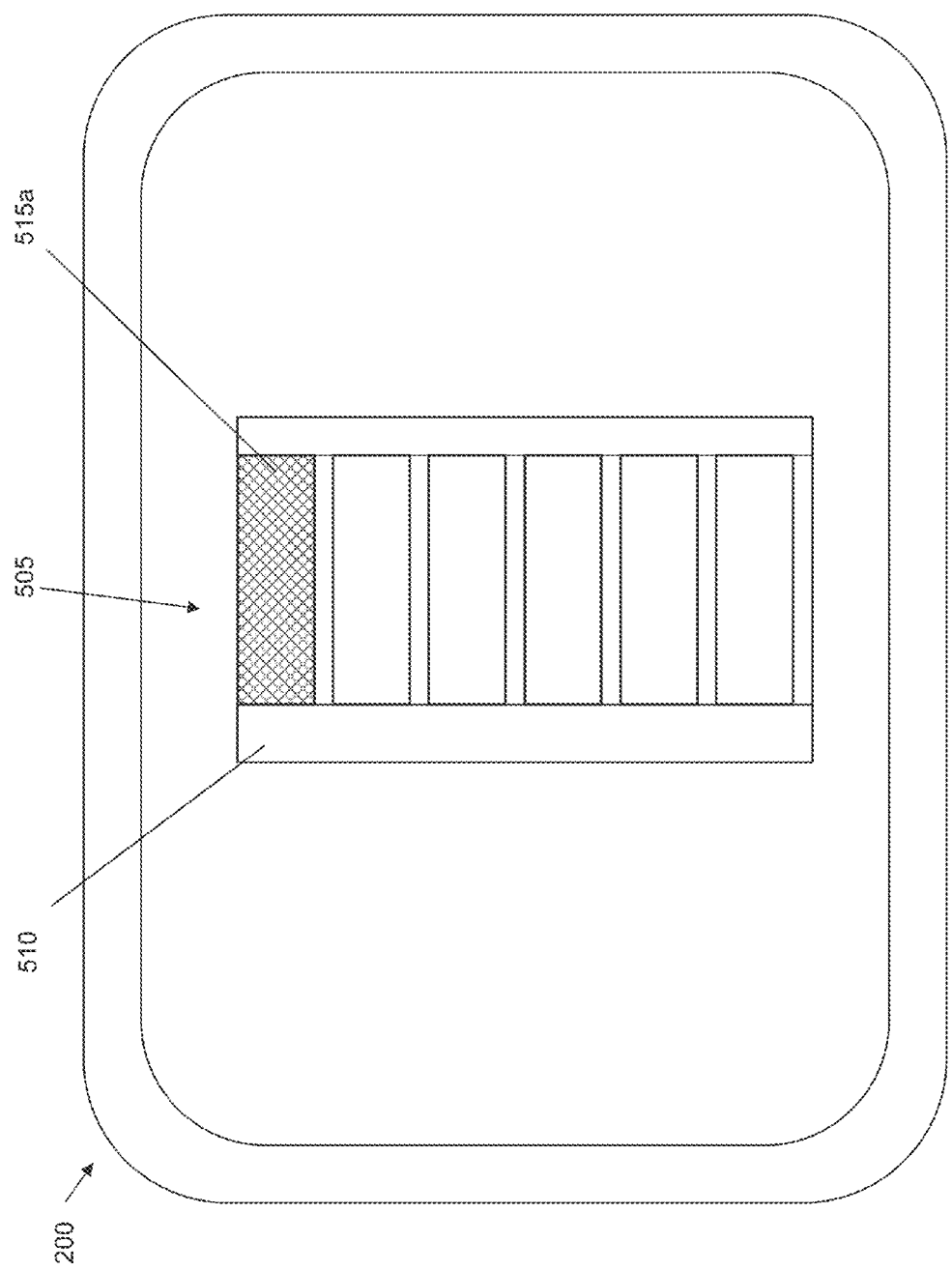
FIGS. 5A-5C depict a mobile computing device authoring a virtual representation of a data center.
Figure 5B:
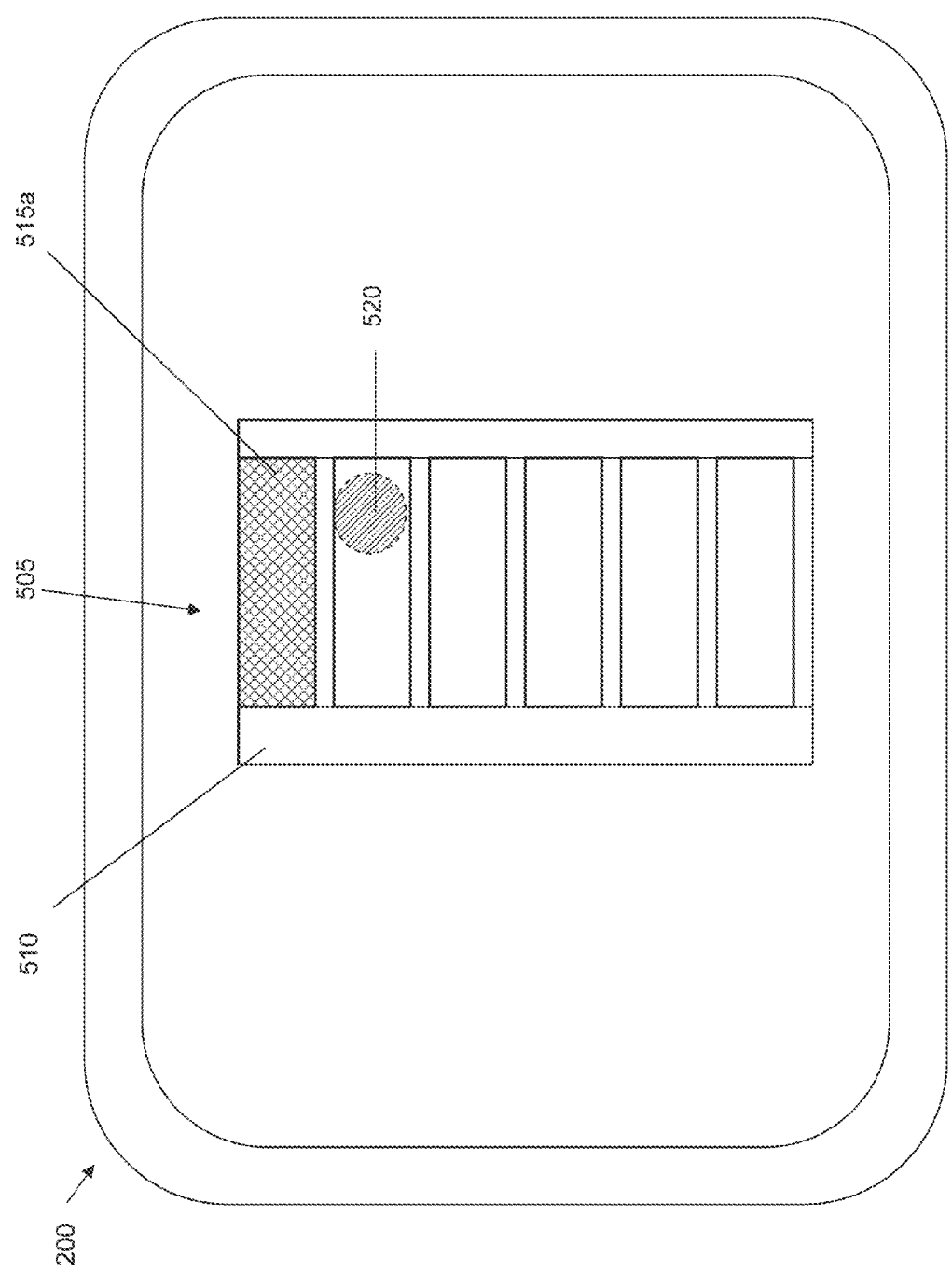
Figure 5C:
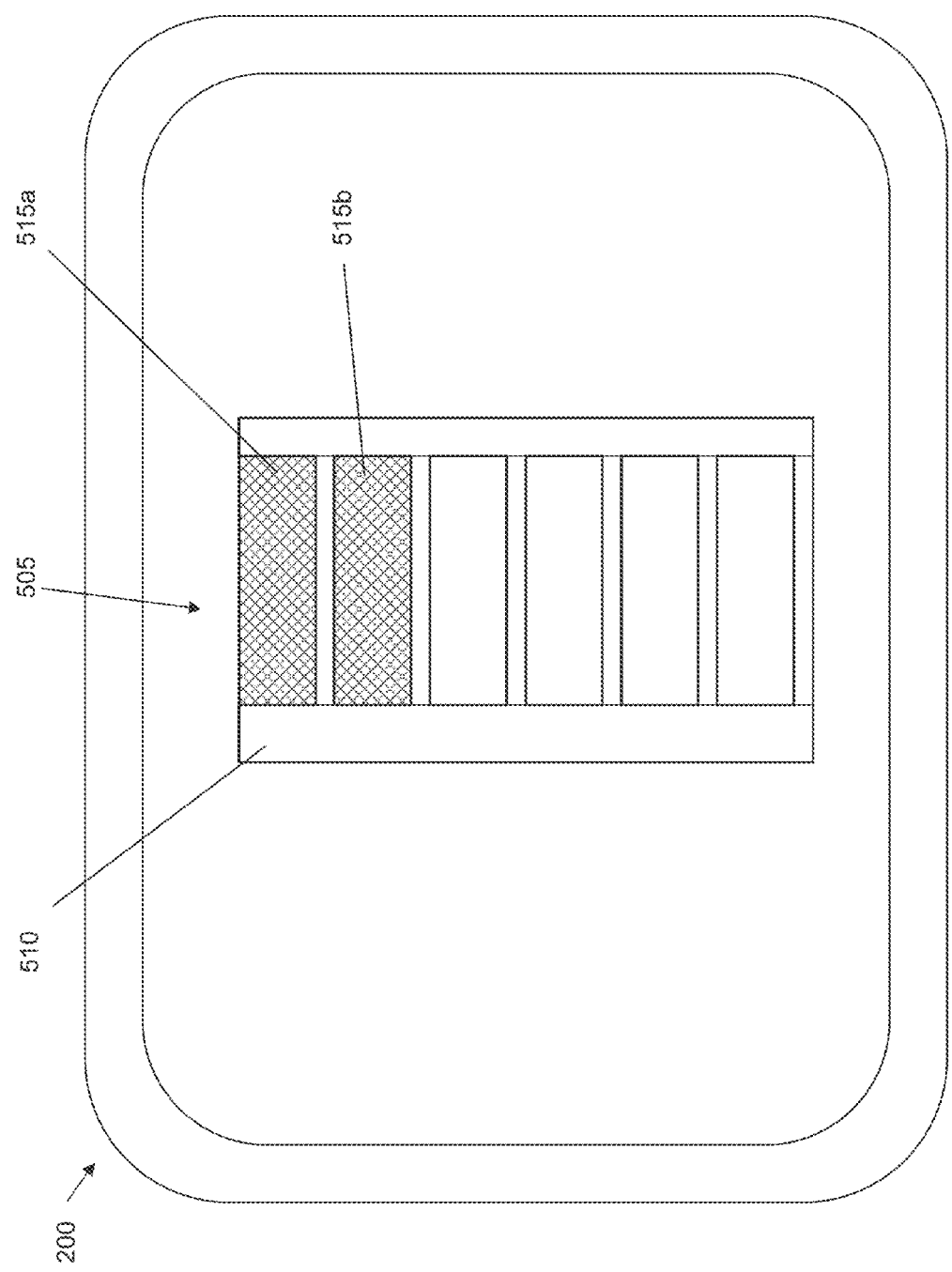

FIGS. 5A-5C depict mobile computing device 200 authoring a virtual representation of a data center. In the illustrated example, a representation of server 140*b* in rack 105*d* is added to the virtual representation of data center 100.

With reference to FIG. 5A, mobile computing device 200 can display visualization 505, which is a visualization of a portion of the virtual representation of data center 100. For example, graphic 510 in visualization 505 represents rack 105*d* in data center 100. Graphic 515*a* in visualization 505 represents server 140*a* in rack 105*d*. Graphic 515 is shown as installed in graphic 510*a* to reflect that server 140*a* is installed in rack 105*d*. As shown in FIG. 5A, the virtual representation of data center 100 does not include a representation of server 140*b*, and accordingly visualization 505 does not include graphics representing server 140*b*. As described below, mobile computing device 200 can add a representation of server 140*b* to the virtual representation of data center 100.

In some embodiments, mobile computing device 200 can use camera 220 to acquire an image (e.g., original image 245) of server 140*b*, including identification marker 145*b*. In some embodiments, mobile computing device 200 can use camera 220 to acquire an image in response to receiving a signal from user input unit 217. Mobile computing device 200 can use optical code analysis logic 250 of data center management module 240 to locate in original image 245 identification marker 145b on server 140b.

In some embodiments, mobile computing device 200 can use optical code analysis logic 250 of data center management module 240 to generate code result 255 by processing the image of identification marker 145b. In some embodiments, code result 255 can be an identity of server 140b (e.g., the serial number of server 140b). In some embodiments, code result 255 can used to determine the identity of server 140b. For example identification analysis logic 260 can use code result 255 to query identification information 265 or management/status information source 270 for the identity of server 140b.

In some embodiments, association logic 280 can receive position information 285. Position information 285 can be received from a user. As illustrated in FIG. 5B, mobile computing device 200 can receive position information 285 via user gesture 520 (e.g., a user tapping display 205 to indicate the position of server 140b in rack 105d).

In some embodiments, mobile computing device 200 can determine position information for an IT component based on one or more identification markers. For example, mobile computing device 200 can determine the position of server 140b in rack 105d based on the position of identification marker 135d (which is affixed to rack 105d), identification marker 145b (which is affixed to server 140b) and the position of identification marker 145a (which is affixed to server 140a). Since the virtual representation of the data center 100 includes position information for identification marker 135d and position information for identification marker 145a, mobile computing device 200 can infer position data for identification marker 145b based, for example, on an image that contains identification markers 135d, 145a, and 145b.

In some embodiments, association logic 280 can associate the identity of server 140b with the position data received. For example, association logic 280 can create an object representing server 140b, populate the member variables that store, e.g., serial number or system identification, and populate the member variables that store position data.

In some embodiments, association logic 280 can add an object representing server 140b as a part of the virtual representation of data center 100. In some embodiments, the object representing server 140b can be a child of the object representing rack 105d. With reference to FIG. 5C, a representation of server 140b is added to the virtual representation of data center 100, and accordingly visualization 505 includes graphic 515b representing server 140b.

The above-described techniques can be implemented in digital electronic circuitry, or in computer hardware, firmware, software, or in combinations of them. The implementation can be as a computer program product, i.e., a computer program tangibly embodied in a non-transitory information carrier, e.g., in a machine-readable storage device, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps can be performed by one or more programmable processors executing a computer program to perform functions of the technology by operating on input data and generating output. Method steps can also be performed by, and apparatus can be implemented as, special purpose logic circuitry, e.g., an FPGA (field programmable gate array) or an ASIC (application-specific integrated circuit). Modules can refer to portions of the computer program and/or the processor/special circuitry that implements that functionality.

Processors suitable for the execution of a computer program include, by way of example, both general and special purpose microprocessors, and any one or more processors of any kind of digital computer. Generally, a processor receives instructions and data from a read-only memory or a random access memory or both. The essential elements of a computer are a processor for executing instructions and one or more memory devices for storing instructions and data. Generally, a computer also includes, or be operatively coupled to receive data from or transfer data to, or both, one or more mass storage devices for storing data, e.g., magnetic, magneto-optical disks, or optical disks. Data transmission and instructions can also occur over a communications network. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in special purpose logic circuitry.

To provide for interaction with a user, the above described techniques can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer (e.g., interact with a user interface element). Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

The above described techniques can be implemented in a distributed computing system that includes a back-end component, e.g., as a data server, and/or a middleware component, e.g., an application server, and/or a front-end component, e.g., a client computer having a graphical user interface and/or a Web browser through which a user can interact with an example implementation, or any combination of such back-end, middleware, or front-end components. The components of the system can be interconnected by any form or medium of digital data communication, e.g., a communication network. Examples of communication networks include a local area network ("LAN") and a wide area network ("WAN"), e.g., the Internet, and include both wired and wireless networks.

The computing system can include clients and servers. A client and server are generally remote from each other and typically interact through a communication network. The relationship of client and server arises by virtue of computer programs running on the respective computers and having a client-server relationship to each other.

The technology has been described in terms of particular embodiments. The alternatives described herein are examples for illustration only and not to limit the alternatives in any way. The steps of the technology can be performed in a different order and still achieve desirable results. Other embodiments are within the scope of the following claims.

What is claimed is:

1. A method executed on a mobile computing device for authoring a virtual representation of a data center comprising:
    scanning, by the mobile computing device, a first identification marker associated with a first information technology (IT) component;
    determining, by the mobile computing device, an identity of the first IT component based on the first identification marker;
    receiving, by the mobile computing device, first position data indicating a position of the first IT component in the data center;
    associating, by the mobile computing device, the identity of the first IT component with the first position data;
    storing, by the mobile computing device, the associated identity of the first IT component and the first position data as a first part of the virtual representation of the data center;
    scanning, by the mobile computing device, a second identification marker associated with a second IT component;
    determining, by the mobile computing device, an identity of the second IT component based on the second identification marker;
    receiving, by the mobile computing device, relative position data indicating a position of the second IT component relative to the first position data;
    determining, by the mobile computing device, second position data indicating a position of the second IT component in the data center based on the first position data and the relative position data;
    associating, by the mobile computing device, the identity of the second IT component with the second position data; and
    storing, by the mobile computing device, the associated identity of the second IT component and the second position data as a second part of the virtual representation of the data center.

2. The method of claim 1, further comprising:
    displaying, by the mobile computing device, a plurality of directional buttons; and
    wherein receiving, by the mobile computing device, relative position data indicating the position of the second IT component relative to the first position data comprises detecting, by the mobile computing device, selection of a directional button of the plurality of directional buttons.

3. The method of claim 1, wherein the relative position data indicating the position of the second IT component relative to the first position data indicates at least one of the second IT component is right of the first position data; the second IT component is left of the first position data; the second IT component is in front of the first position data; the second IT component is behind the first position data; the second IT component is below the first position data; the second IT component is above the first position data.

4. The method of claim 1, wherein the first IT component and the second IT component are racks.

5. The method of claim 1, wherein the relative position data indicating the position of the second IT component relative to the first position data indicates the position of the second IT component within the first IT component.

6. The method of claim 5, wherein the first IT component is a rack and the second IT component is one of a server, storage controller, or disk enclosure in the rack.

7. The method of claim 5, wherein the first IT component is a disk enclosure and the second IT component is a hard drive.

8. The method of claim 1, wherein the first identification marker and the second identification marker are QR codes.

9. A computer program product, tangibly embodied in a non-transitory computer readable storage medium, comprising instructions being operable to cause a mobile computing device to:
    scan a first identification marker associated with a first information technology (IT) component;
    determine an identity of the first IT component based on the first identification marker;
    receive first position data indicating a position of the first IT component in the data center;
    associate the identity of the first IT component with the first position data;
    store the associated identity of the first IT component and the first position data as a first part of the virtual representation of the data center;
    scan a second identification marker associated with a second IT component;
    determine an identity of the second IT component based on the second identification marker;
    receive relative position data indicating a position of the second IT component relative to the first position data;
    determine second position data indicating a position of the second IT component in the data center based on the first position data and the relative position data;
    associate the identity of the second IT component with the second position data; and
    store the associated identity of the second IT component and the second position data as a second part of the virtual representation of the data center.

10. The computer program product of claim 9, further comprising instructions being operable to cause a mobile computing device to:
    display a plurality of directional buttons; and
    wherein the instructions being operable to cause the mobile computing device to receive relative position data indicating the position of the second IT component relative to the first position data comprise instructions being operable to cause the mobile computing device to detect selection of a directional button of the plurality of directional buttons.

11. The computer program product of claim 9, wherein the relative position data indicating the position of the second IT component relative to the first position data indicates at least one of the second IT component is right of the first position data; the second IT component is left of the first position data; the second IT component is in front of the first position data; the second IT component is behind the first position data; the second IT component is below the first position data; the second IT component is above the first position data.

12. The computer program product of claim 9, wherein the first IT component and the second IT component are racks.

13. The computer program product of claim 9, wherein the relative position data indicating the position of the second IT component relative to the first position data indicates the position of the second IT component within the first IT component.

14. The computer program product of claim 13, wherein the first IT component is a rack and the second IT component is one of a server, storage controller, or disk enclosure in the rack.

15. The computer program product of claim 13, wherein the first IT component is a disk enclosure and the second IT component is a hard drive.

16. The computer program product of claim 9, wherein the first identification marker and the second identification marker are QR codes.

17. A mobile computing device comprising:
a scanner; and
a data center management module configured to:
scan, with the scanner, a first identification marker associated with a first information technology (IT) component;
determine an identity of the first IT component based on the first identification marker;
receive first position data indicating a position of the first IT component in the data center;
associate the identity of the first IT component with the first position data;
store the associated identity of the first IT component and the first position data as a first part of the virtual representation of the data center;
scan, with the scanner, a second identification marker associated with a second IT component;
determine an identity of the second IT component based on the second identification marker;
receive relative position data indicating a position of the second IT component relative to the first position data;
determine second position data indicating a position of the second IT component in the data center based on the first position data and the relative position data;
associate the identity of the second IT component with the second position data; and
store the associated identity of the second IT component and the second position data as a second part of the virtual representation of the data center.

18. The mobile computing device of claim 17, further comprising a display, wherein the data center management module is configured to:
display on the display a plurality of directional buttons; and
receive relative position data indicating the position of the second IT component relative to the first position data by detecting selection of a directional button of the plurality of directional buttons.

19. The mobile computing device of claim 17, wherein the relative position data indicating the position of the second IT component relative to the first position data indicates at least one of the second IT component is right of the first position data; the second IT component is left of the first position data; the second IT component is in front of the first position data; the second IT component is behind the first position data; the second IT component is below the first position data; the second IT component is above the first position data.

20. The mobile computing device of claim 17, wherein the first identification marker and the second identification marker are QR codes.

\* \* \* \* \*